United States Patent
Lee et al.

(10) Patent No.: US 9,245,925 B1
(45) Date of Patent: Jan. 26, 2016

(54) RRAM PROCESS WITH METAL PROTECTION LAYER

(71) Applicant: Macronix International Co., Ltd., Hsinchu (TW)

(72) Inventors: Feng-Min Lee, Hsinchu (TW); Erh-Kun Lai, Taichung (TW); Yu-Yu Lin, Taipei County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/598,116

(22) Filed: Jan. 15, 2015

(51) Int. Cl.
*H01L 45/00* (2006.01)
*H01L 27/24* (2006.01)

(52) U.S. Cl.
CPC ............ *H01L 27/2436* (2013.01); *H01L 45/08* (2013.01); *H01L 45/1233* (2013.01); *H01L 45/1253* (2013.01); *H01L 45/146* (2013.01); *H01L 45/1633* (2013.01)

(58) Field of Classification Search
None
See application file for complete search history.

(56) References Cited

U.S. PATENT DOCUMENTS

| | | | |
|---|---|---|---|
| 7,978,496 B2 | 7/2011 | Kumar et al. | |
| 8,279,656 B2 | 10/2012 | Chien et al. | |
| 8,618,526 B2 * | 12/2013 | Sorada et al. | 257/4 |
| 2011/0233511 A1 * | 9/2011 | Kawashima et al. | 257/4 |
| 2012/0146223 A1 * | 6/2012 | Zhao et al. | 257/751 |
| 2014/0264232 A1 * | 9/2014 | Lee et al. | 257/4 |

* cited by examiner

*Primary Examiner* — Scott B Geyer
(74) *Attorney, Agent, or Firm* — Haynes Beffel & Wolfeld LLP

(57) ABSTRACT

Metal oxide based memory devices and methods for manufacturing are described herein. A method for manufacturing a memory cell includes forming an insulation layer on an access device followed by forming vias through the insulation layer to expose the first and second access device terminals. First and second interlayer conductors extending through the vias are formed next. Top surfaces of the interlayer conductors are oxidized to form oxide layers. The oxide layer on the first interlayer conductor forms a memory layer. On top of the insulation layer a layer of protection metal is formed covering the oxide layers. The layer of protection metal is patterned and etched to form a top electrode layer covering the memory layer. The oxide layer on the second interlayer conductor is removed. Parallel first and second access lines are then formed on the top electrode layer and the second interlayer conductor, respectively.

20 Claims, 10 Drawing Sheets

RRAM PROCESS WITH METAL PROTECTION LAYER

BACKGROUND

1. Field of the Invention

The present invention relates to metal oxide based memory devices and methods for manufacturing such devices.

2. Description of Related Art

Resistive random access memory, RRAM, is a type of nonvolatile memory that provides the benefits of small cell size, scalability, ultrafast operation, low-power operation, high endurance, good retention, large On/Off ratio, and CMOS compatibility. One type of RRAM includes metal oxide layers than can be caused to change resistance between two or more stable resistance ranges by application of electrical pulses at levels suitable for implementation in integrated circuits.

In prior methods of forming a transition metal oxide (TMO) memory layer, photoresist is used as an etching mask to protect the portions of TMO in a designated region that will be the memory layer, while other portions of TMO that are not part of the memory layer are etched away. After etching, the photoresist is stripped and this stripping may cause damage to the TMO memory layer. Prior methods of avoiding this damage caused by stripping have included using a hard mask such as $SiO_2$ or $Si_3N_4$ prior to oxidization to define surfaces to be oxidized to form the TMO memory layers. By defining which regions to oxidize, the step of etching away unwanted oxidized regions is eliminated. However, this process of using a hard mask adds two extra processes to the previously described method involving damage caused by the photoresist strip. These additional steps in the process add time and cost to production, which are undesirable.

It is therefore desirable to provide a memory cell and method of manufacture that eliminates the possibility of damage to the TMO memory layer caused by a photoresist strip while adding a minimal amount of manufacturing steps in order to provide a cost-effective method of manufacture.

SUMMARY

Memory devices based on metal oxide memory layers, for example tungsten-oxide, are described along with methods for manufacturing.

A memory cell of a memory device as described herein includes an access device with a first terminal and a second terminal, a first interlayer conductor contacting the first terminal of the access device, a memory element on an electrode surface of the first interlayer conductor, a top electrode layer on the memory element, and a second interlayer conductor on the second terminal of the access device. The top electrode layer and the electrode surface of the first interlayer conductor are the electrodes that establish electrical contact with the memory element. The top electrode layer on the first interlayer conductor and the second interlayer conductor are connected to first and second access lines respectively, such as a bit line and a source line. The top electrode layer is formed separately from the first access line and may comprise different materials than the first access line. In embodiments, the top electrode layer comprises a barrier metal or metal compound which acts as a barrier between the memory element and a mask layer, for example a photoresist layer, during manufacturing of the memory to prevent damage to the memory element.

The memory element comprises a layer of material comprising a transition metal oxide (TMO), such as WOx. The memory element is sandwiched between the first interlayer conductor and the top electrode layer. In embodiments, the memory element is comprised of an oxide of the material of the first interlayer conductor and formed by oxidizing the first interlayer conductor. The memory element is programmable to at least two resistance states.

The access device may be a transistor, a diode, or another similar device. The access device is located on a first side (e.g., below) of an insulation layer. The assembly of the first interlayer conductor and memory element extends from the first terminal of the access device, through the insulation from the first side to a second side. The second interlayer conductor extends from the second terminal of the access device through the insulation layer from the first side to the second side of the insulation layer.

The top electrode layer is located on the memory element and may also cover a portion of the second side of the insulation layer. In embodiments, the top electrode layer contacts a first access line, for example a bit line of a memory device. The top electrode layer and the first access line may be comprised of different materials. Further, in embodiments, the end of the second interlayer conductor on the second side of the insulation layer contacts a second access line, for example a source line of a memory device. In embodiments, the first and second access lines are parallel and are located in the same layer of the device. In embodiments, the first and second access lines are perpendicular to a third access line, the third access line being a word line connected to the gate of a transistor access device.

A method for manufacturing a memory cell of a memory device as described herein includes forming an insulation layer on an access device including a first and second terminal. This step may be followed by a step of forming vias through the insulation layer to expose the first and second terminals. First and second interlayer conductors extending through the vias in insulation layer contacting the first and second terminals, respectively, may then be formed. The top surfaces of the first and second interlayer conductors may then be oxidized to form self-aligned oxide layers on top of the conductors. The oxide layer on the first interlayer conductor forms a self-aligned metal oxide based memory layer. On top of the insulation layer a layer of protection metal may be formed covering the oxide layers of the first and second interlayer conductors. The layer of protection metal may then be patterned so that after an etching step only a portion of the layer remains, forming a top electrode layer covering the memory layer on the first interlayer conductor. In the same or subsequent step, the oxide layer is removed from the second interlayer conductor. This step is followed by forming a first access line on the top electrode layer over the first interlayer conductor. In the same or subsequent step, a second access line is formed on the second interlayer conductor parallel to the first access line. The first and second access lines may be comprised of the same or different materials than the top electrode layer.

The structure and methods of the present invention are disclosed in the detailed description below. Other aspects and advantages of the present invention can be seen on review of the drawings, the detailed description and the claims, which follow.

BRIEF DESCRIPTION OF THE DRAWINGS

The invention will be described with respect to the specific embodiments thereof, and reference will be made to the drawings, in which.

DETAILED DESCRIPTION

Figure 1:
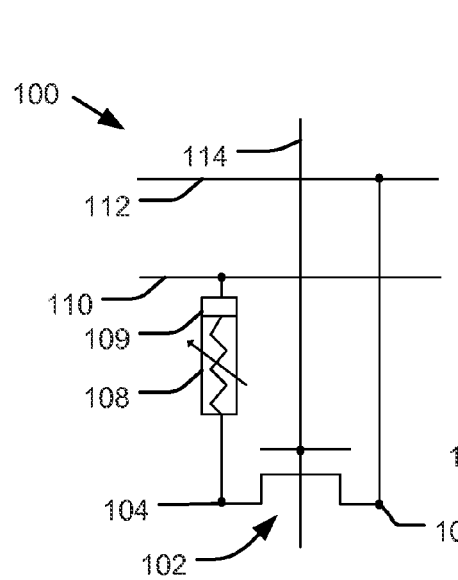
FIG. 1 illustrates a schematic of a memory cell in a memory device.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic of a memory cell 100 in accordance with an embodiment. The memory cell includes an access device in the form of a transistor 102 with a first terminal 104 and a second terminal 106. The memory cell further includes a memory element 108 located between the first terminal 104 and a first access line 110, in the example a bit line, and a second access line 112, in the example a source line, connected to the second terminal 106. Located between the memory element 108 and the first access line 110 is a top electrode layer 109. In the embodiment shown with the access device being transistor 102, the memory device further includes a third access line 114, in the example a word line, connected to the gate of the transistor 102. In embodiments with a diode as an access device, a third access line is not needed.

Figure 2A:
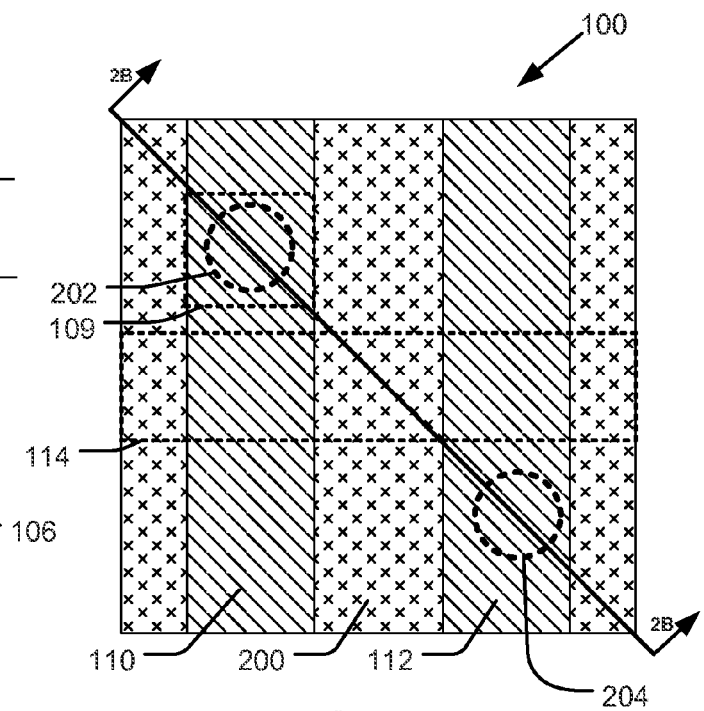
FIG. 2A illustrates a top view of a memory cell.

FIG. 2A illustrates a top view of a memory cell in accordance with an embodiment during manufacturing. The memory cell includes the first access line 110, second access line 112, and insulation layer 200. The view further includes broken lines to show elements not visible due to being located below the elements shown. The non-visible elements include a first interlayer conductor 202, a second interlayer conductor 204, a top electrode layer 109, and a third access line 114.

Figure 2B:
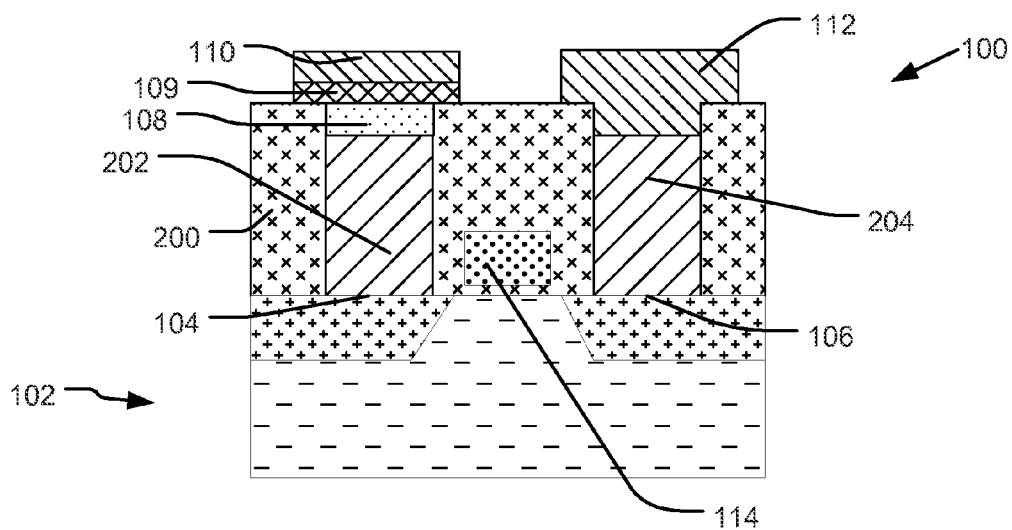
FIG. 2B illustrates a cross-section of the memory cell shown in FIG. 2A.

FIG. 2B illustrates a cross-sectional view of the embodiment of the memory cell shown in FIG. 2A. The embodiment of the memory cell 100 includes a transistor access device 102 with a first terminal 104 and a second terminal 106. On top of the access device is the insulation layer 200. The insulation layer is dielectric and in embodiments is comprised of silicon dioxide.

Extending from the first terminal 104, on a first side of the insulation layer 200, through the insulation layer 200, is the first interlayer conductor 202 and a memory element 108. Extending from the second terminal 106 through the insulation layer 200 is the second interlayer conductor 204. In the embodiment shown, the access device is a transistor 102 and the first interlayer conductor 202 contacts a first current conducting terminal, and the second interlayer conductor 204 contacts a second current conducting terminal. In embodiments, the first interlayer conductor and memory element may be connected to either of a first or second current conducting terminal of a transistor. Further, in embodiments, the access device may be a diode with two terminals.

The first and second interlayer conductors 202, 204 are comprised of electrically conductive elements. The interlayer conductors may be comprised of, for example, one or more elements selected from the group consisting of Ti, W, Mo, Al, Hf, Ta, Cu, Pt, Ir, La, Ni, N, O, and Ru, and combinations thereof, and in some embodiments may comprise more than one layer.

The memory element 108 is located on an electrode surface of the first interlayer conductor 202 so that the first interlayer conductor 202 is located between the first terminal 104 of the access device and the memory element 108. The memory element 108 includes a layer of a material that is programmable to at least two resistance states. For example, the programmable resistance layer in of the memory element 108 may comprise one or more tungsten-oxygen compounds (WOx), for example one or more of $WO_3$, $W_2O_5$, $WO_2$. In the embodiment shown, the memory element 108 is a single layer formed by oxidizing the top portion of the first interlayer conductor 202, and therefore is self-aligned with the first interlayer conductor 202. In alternative embodiments, the memory element 108 may comprise other metal oxides, for example a metal oxide from the group of nickel oxide, aluminum oxide, magnesium oxide, cobalt oxide, titanium oxide, titanium-nickel oxide, zirconium oxide, and copper oxide.

On top of the memory element 108 is the top electrode layer 109. The top electrode layer 109 forms a top electrode for the memory element 108, and the electrode surface of the first interlayer conductor 202 forms a bottom electrode of the memory element 108. The top and bottom electrodes electrically contact the memory element 108 so that a conductive path is formed through the memory element 108 between the first access line 110 and the first terminal 104 of the access device. In the embodiment shown the top electrode layer 109 covers the memory element 108 and a portion of the top of the insulation layer 200, and is larger than the top of the memory element 108. Further, in the embodiment shown, the top electrode layer 109 has edges self-aligned with edges of the first access line 110. This self-alignment is described below in the method of manufacture and is shown in FIGS. 3M-3P. In embodiments, the top electrode layer may be the same size as the top of the memory element 108. In the embodiment shown, the top electrode layer 109 is a single layer of TiN. However, the top electrode layer 109 may comprise one or more layers of different materials comprised of one or more elements selected from the group consisting of Ti, TiN, W, AlCu, TaN, Cu, Hf, Ta, Au, Pt, Ag, and other metals which are CMOS compatible and do not alter the variable resistance properties of the memory element.

The first access line 110 is located on the top electrode layer 109 with a current path formed between the memory element 108 and the first access line 110. The second access line 112 contacts the second interlayer conductor 204 with a current path between the second terminal 106 and the second access line 112. As shown in FIG. 2B, in embodiments there are no additional layers present between the second access line 112 and the second interlayer conductor 204. Further, in the embodiment shown in FIG. 2B, the first and second access lines 110, 112 are comprised of the same material and the top electrode layer 109 is comprised of a different material. The first and second access lines may comprise one or more elements including Ti, W, Al, Cu, Pt, TaN, Hf, Ta and Ni.

In the embodiment shown in FIGS. 2A and 2B, the access device is a transistor 102, and a third access line 114, in this example a word line, is located in the insulation layer 200 at the gate of the transistor 102.

In operation, voltages applied between the first access line 110 and first interlayer conductor 202 will cause current to flow between the first access line 110 and the first interlayer conductor 202 via the memory element 108 and top electrode layer 109. This current can induce a programmable change in electrical resistance of the memory element 108, the electrical resistance indicating a data value stored in the memory cell 100. In some embodiments the memory element 108 of the memory cell 100 can store two or more bits of data.

Figure 3A:
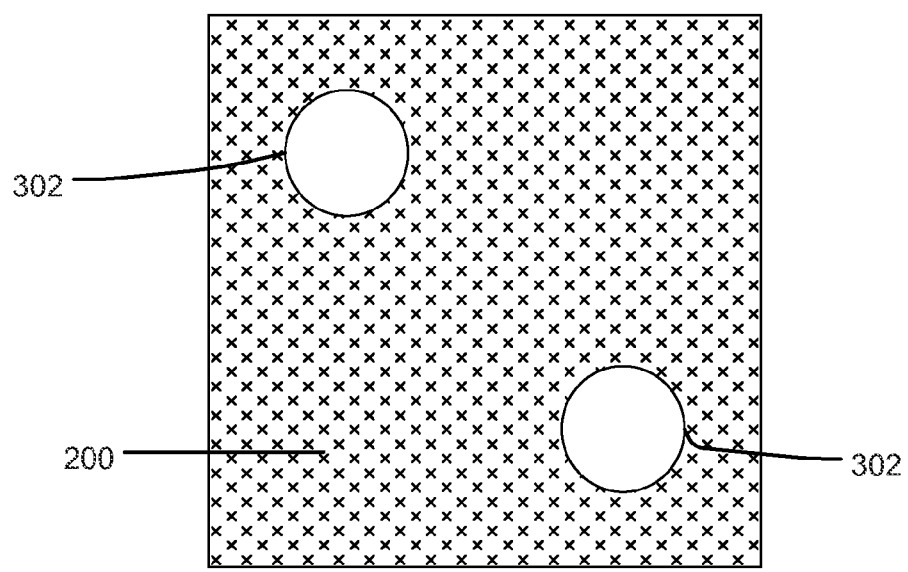
FIGS. 3A-3P illustrate top and cross-sectional views of a manufacturing method in accordance with an embodiment.
Figure 3B:
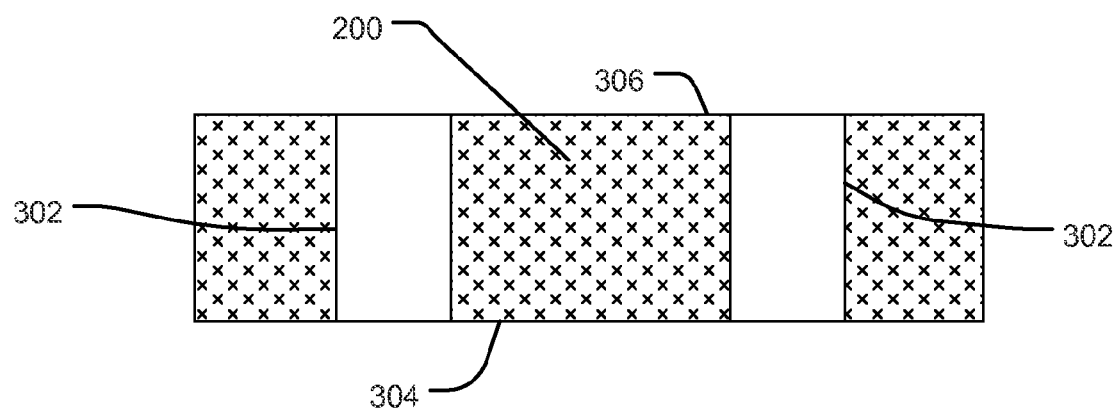
Figure 3C:
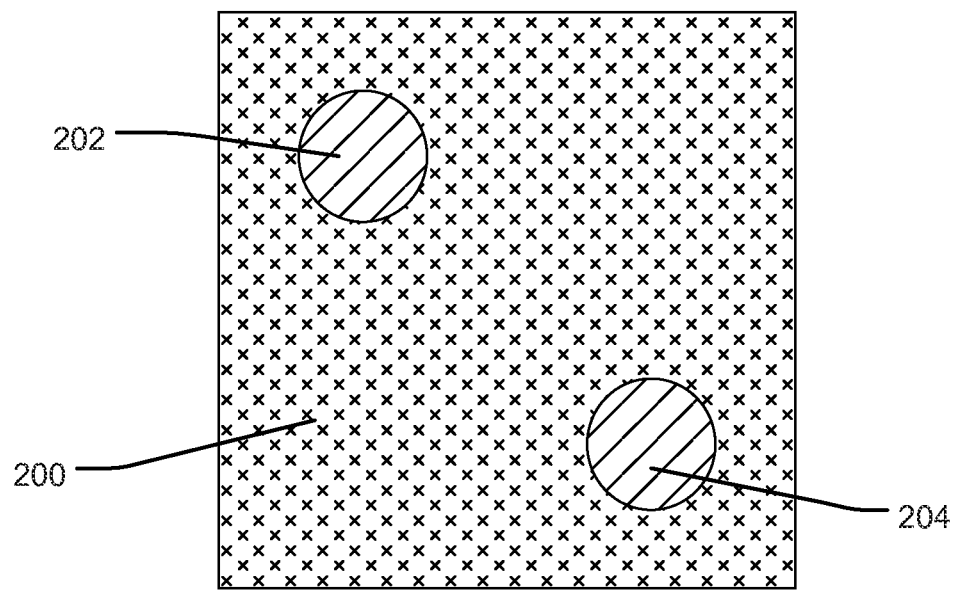
Figure 3D:
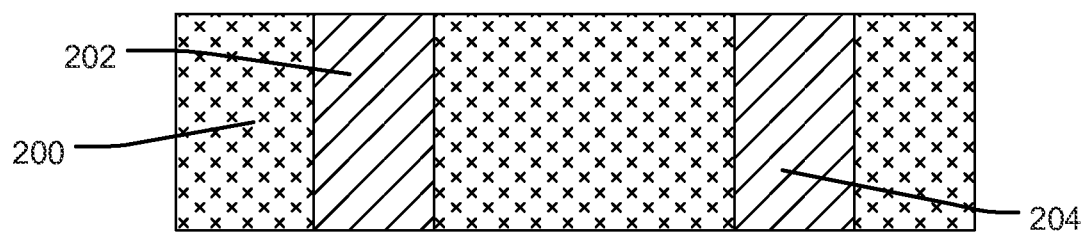
Figure 3E:
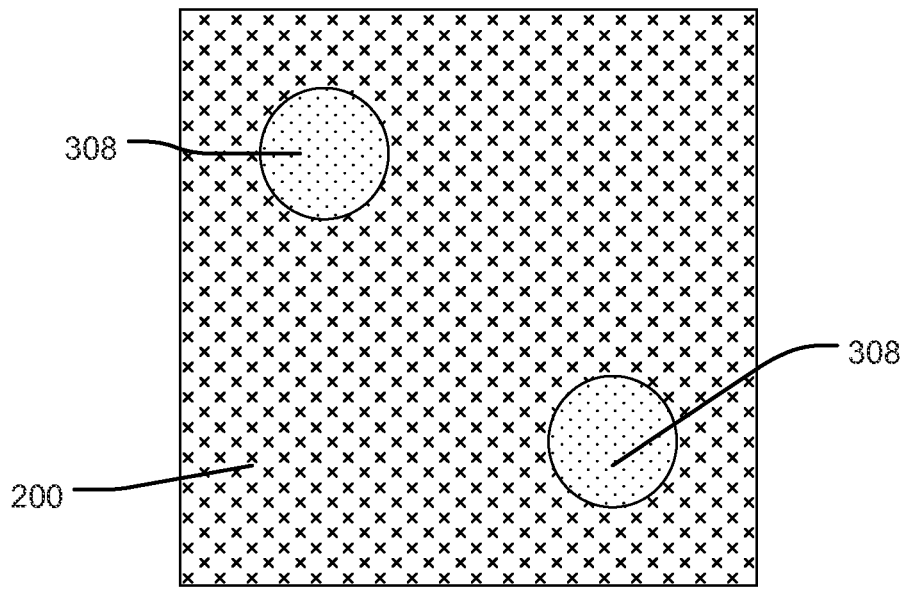
Figure 3F:
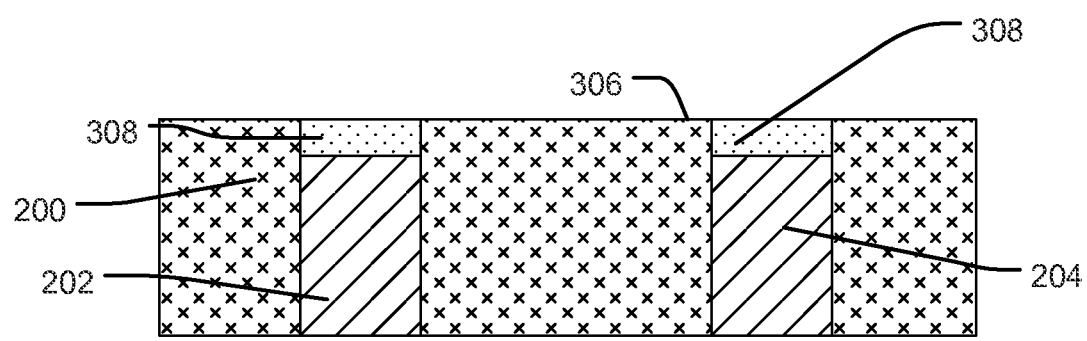
Figure 3G:
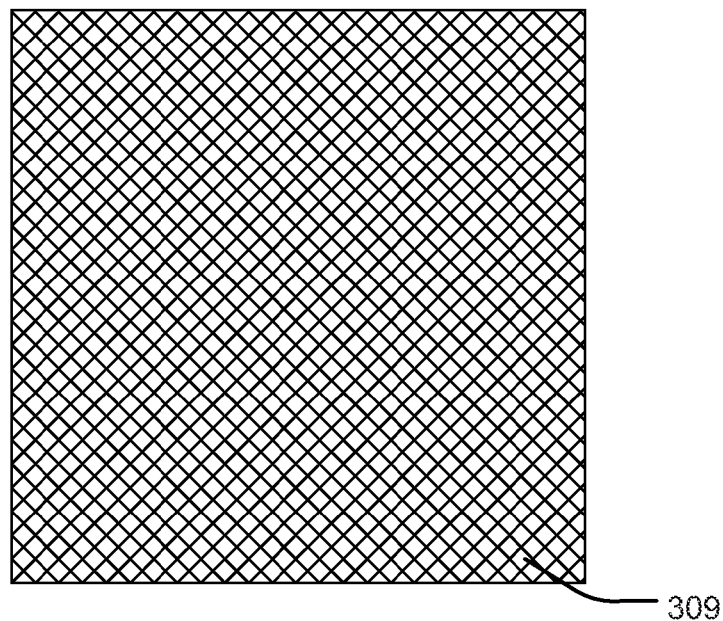
Figure 3H:
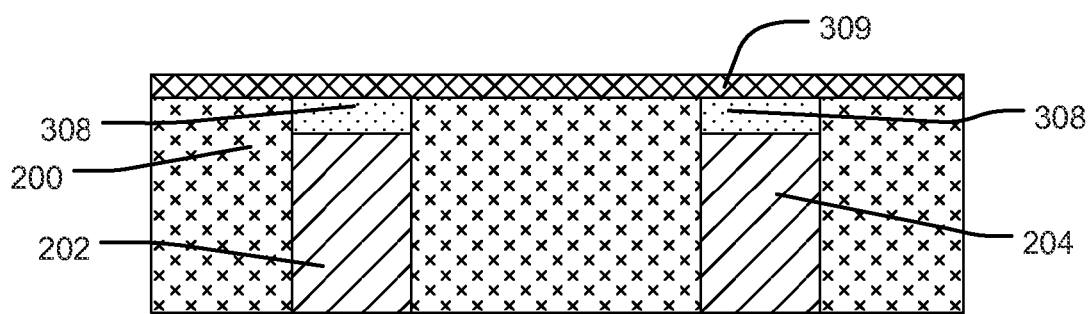
Figure 3I:
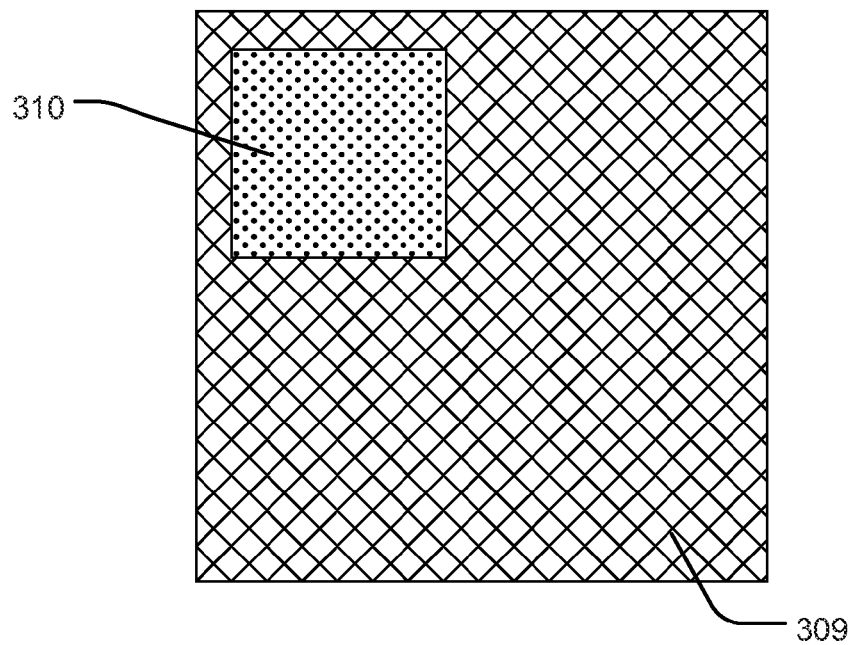
Figure 3J:
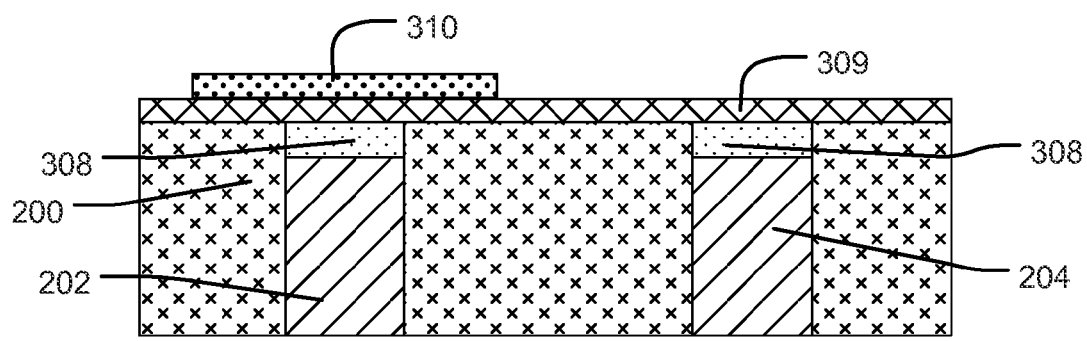
Figure 3K:
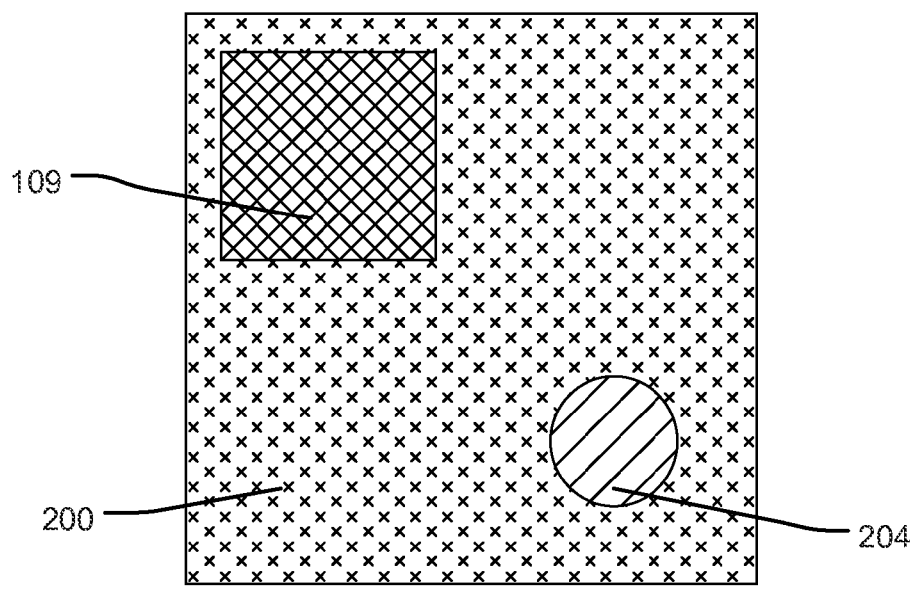
Figure 3L:
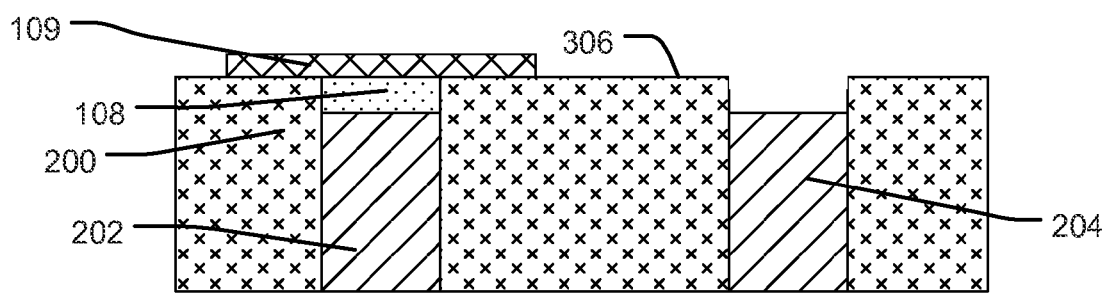
Figure 3M:
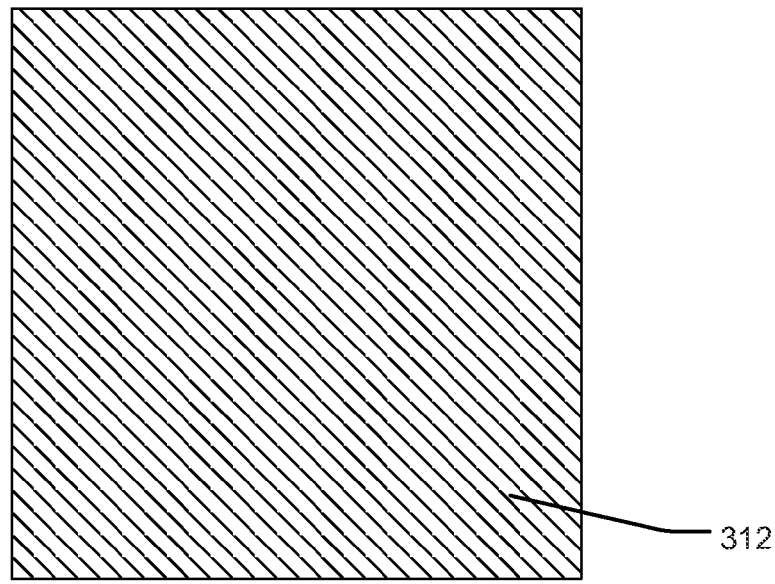
Figure 3N:
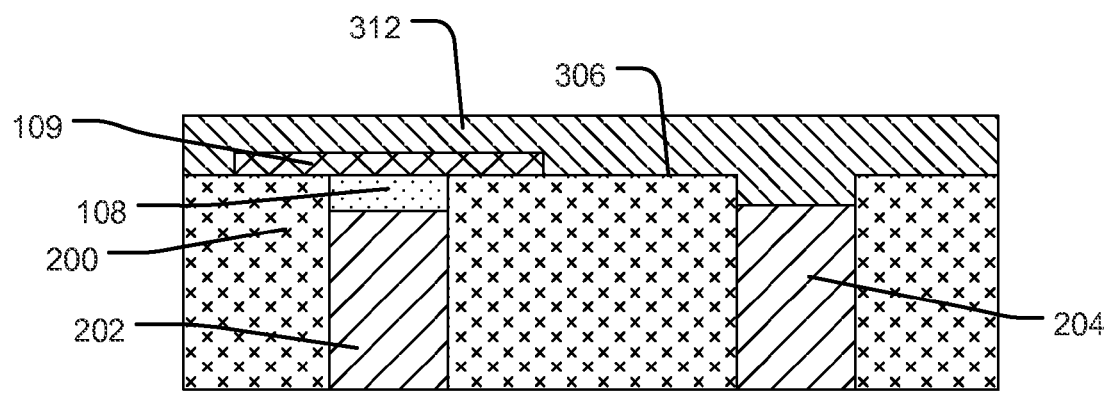
Figure 3O:
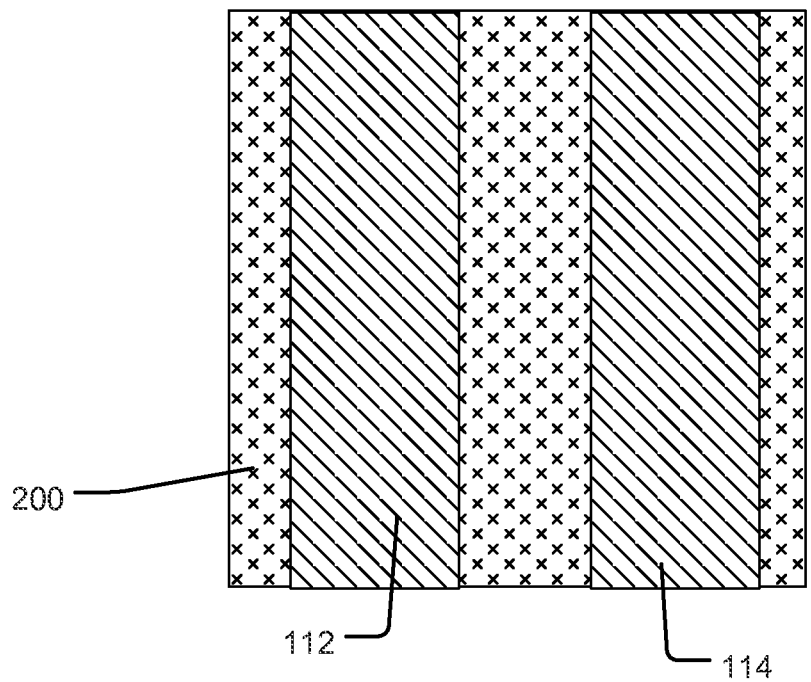
Figure 3P:
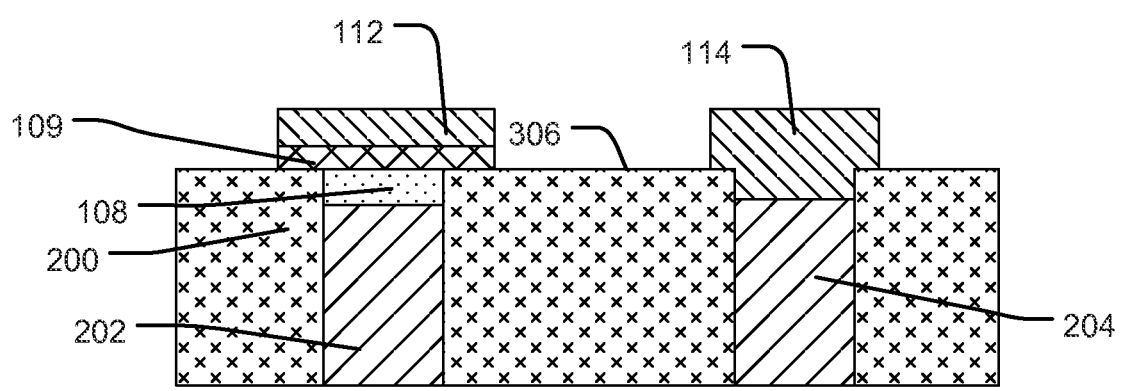

A memory cell in an array of memory cells can be formed by the manufacturing steps illustrated in FIGS. 3A-3P. The illustrations of the processes omit an access device and components of the memory cell that are specific to particular access devices.

FIGS. 3A and 3B illustrate a first step forming vias 302 through an insulation layer 200 extending through the insulation layer from a first side 304 of the insulation layer to a second side 306 of the insulation layer. The first side 304 is located proximate to an access device and the vias are formed to expose first and second terminals of the access device from the second side 306 of the insulation layer 200.

Next, first interlayer conductor 202 and second interlayer conductor 204 are formed within the vias in the insulation layer 200, resulting in the structure illustrated in FIGS. 3C and 3D. In the embodiment shown, the interlayer conductors comprise tungsten plugs formed within the vias by chemical vapor deposition CVD followed by a planarization step such as chemical mechanical polishing CMP.

Next, a metal oxide layer 308 is formed on the exposed surfaces of the first and second interlayer conductors 202, 204 proximate to the second side 306 of the insulation layer 200, resulting in the structure illustrated in FIGS. 3E and 3F. This metal oxide layer may be formed using various deposition and oxidation techniques, for example rapid thermal oxidation (RTO), photo-oxidation, direct plasma oxidation, downstream plasma oxidation, sputtering, and reactive sputtering. Plasma oxidation can result in a graded $W_xO_y$ having concentrations of tungsten-oxygen compounds that have a distribution that varies with distance from the surface exposed to oxidation. In the embodiment shown, the metal oxide layer 308 is formed only on the first and second interlayer conductors 202, 204 through an oxidation process. Forming the metal oxide on the interlayer conductors has the advantage of creating self-aligned layers of metal oxide on the interlayer conductors. The oxide layer 308 on the first interlayer conductor is the variable resistance memory layer forming memory element 108 of the memory cell 100. In the embodiment shown, because the oxide layer 308 is self-aligned on the interlayer conductors 202, 204, no mask is needed to prevent oxidation of the second interlayer conductor 204, because this unwanted oxidation layer will be removed in a subsequent step.

Next, a layer of protection metal 309 is deposited on the insulation layer 200, resulting in the structure illustrated in FIGS. 3G and 3H. The layer of protection metal 309 covers the oxide layers 308 of the first and second interlayer conductors 202, 204 as well as the insulation layer 200. This layer of protection metal 309 is beneficial to the memory element 108 on the first interlayer conductor 202 because it may be formed right after the metal oxide layer 308 is formed, which reduces the risk of process damage to the memory element 108. In the embodiment shown, the protection metal is a single layer of TiN. In embodiments, the protection metal layer may be comprised of Ti, TiN, W, AlCu and other metals that are CMOS compatible.

Next, a layer of photoresist 310 is used as a mask to protect a portion of the layer of protection metal 309 from a subsequent etching step, resulting in the structure illustrated in FIGS. 3I and 3J. The layer of photoresist 310 is on top of the layer of protection metal 309 and therefore does not contact the oxide layer 308 on the first interlayer conductor 202, which is the memory element 108, and therefore this oxide layer 308 is not damaged during the photoresist strip process.

Next, the layer of protection metal 309 is etched to form the top electrode layer 109 on the memory element 108, resulting in the structure illustrated in FIGS. 3K and 3L. In the same or second etching step, the oxide layer 308 of the second interlayer conductor 204 is etched away leaving an un-oxidized surface of the second interlayer conductor 204. The top electrode layer 109 covers the memory element 108 and a portion of the second side 306 of the insulation layer 200, the coverage extending beyond the edges of the memory element.

After a top electrode layer 109 is formed over the memory element 108 that electrically contacts the memory element, a layer of access line material 312 is deposited on the second side 306 of the insulation layer 200, resulting in the structure illustrated in FIGS. 3M and 3N. A photo process may be used including patterning and etching the layer of access line material 312 to form a first access line 110 and a second access line 112 parallel to the first access line, resulting in the structure illustrated in FIGS. 3O and 3P. In embodiments, the deposition and etching of material for the first and second access lines may be done in different steps with layers of insulation material deposited in between steps. Further, the first and second access lines may be formed in configurations other than parallel. As shown in FIGS. 3K and 3L, prior to the etching of the first and second access lines, the top electrode layer 109 extends beyond the portion of access line material that will become the first access line 110. During the etching to form the access lines, the top electrode layer 109 is also etched resulting in a self-aligned top electrode layer as shown in FIGS. 3O and 3P.

Figure 4:
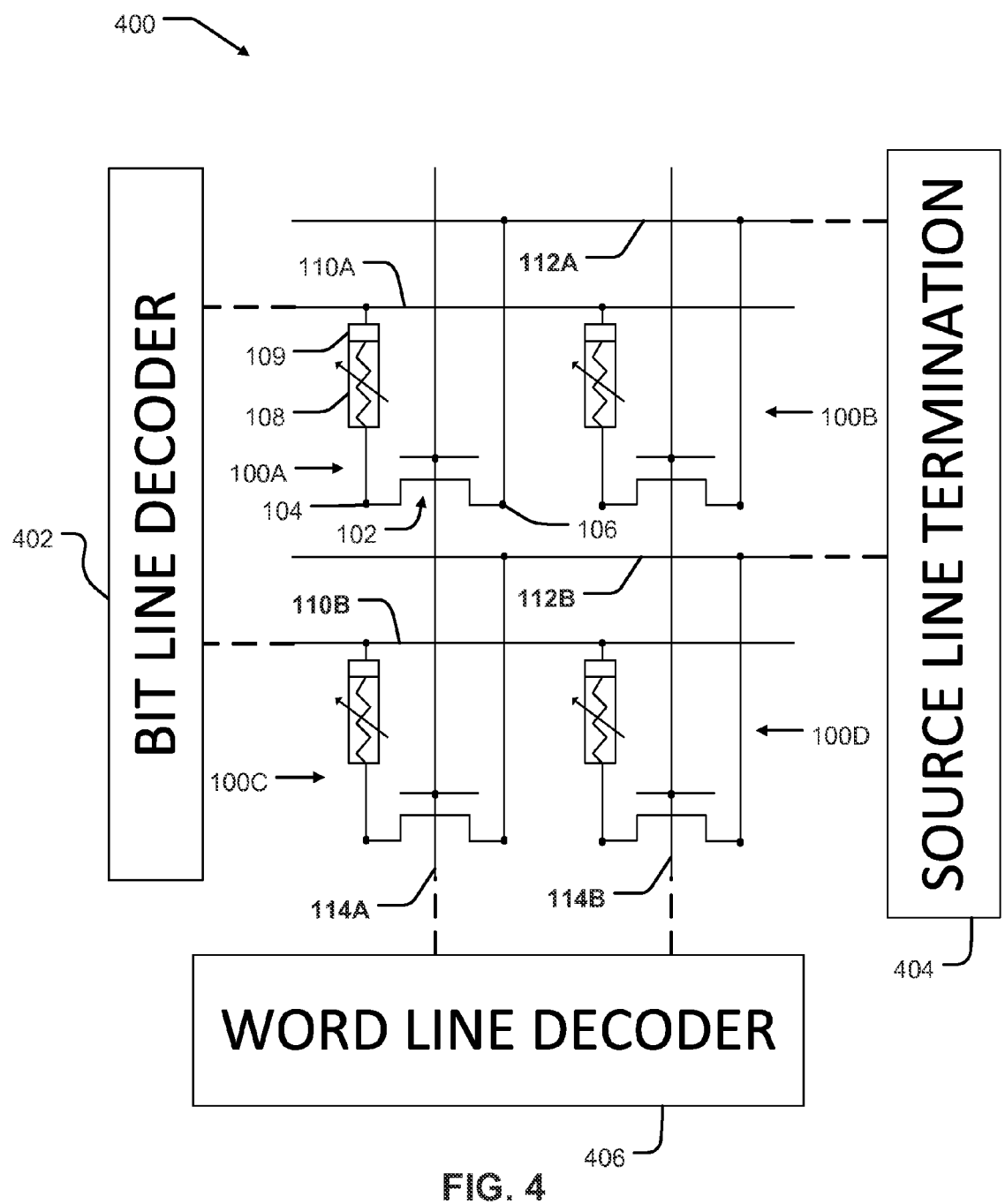
FIG. 4 is a schematic illustration of a memory array implementing memory cells as described herein.

As shown in FIG. 4 a plurality of memory cells 100A, 100B, 100C, 100D, may be part of an array of memory cells in a memory device 400. Each of the memory cells in the array includes an access transistor 102, a memory element 108 and top electrode layer 109. The four memory cells 100A, 100B, 100C, 100D, shown, represent a small section of an array that can include millions of memory cells. A plurality of first access lines 110A, 110B, in the portion of the example showing two bit lines, extend in a first direction and are in electrical communication with bit line decoder 402 and the top electrode layers 109 of the memory cells 100A, 100B, 100C, 100D. In the illustrated embodiment, each of the memory elements 108 are arranged between the first current-conducting terminal of the corresponding access device transistor 102 and the corresponding first access line. Alternatively, the memory elements may be on the second current-conducting terminal of the corresponding access device.

Second current-conducting terminals of each of the access transistors 102 of the memory cells 100A, 100B, 100C, 100D, are connected to second access lines 112A, 112B, in the portion of the example showing two source lines, that terminate at a source line termination circuit 404 such as a ground terminal. In the embodiment shown, the second access lines run parallel to the first access lines, which provides the benefit of fewer manufacturing steps as the bit lines and word lines may be formed in the same step as disclosed above.

In the embodiment shown with access transistors 102, a plurality of third access lines 114A, 114B, in the portion of the example showing two word lines, extend along a second direction perpendicular to the first direction. Word lines are in electrical communication with word line decoder 406. The gates of access transistors 102 of memory cells 100A and 100C are connected to third access line 114A, and the gates of access transistors 102 of memory cells 100B and 100D are connected to third access line 114B.

It will be understood that the memory array is not limited to the array configuration illustrated in FIG. 4 and additional array configurations can also be used with memory cells including a top electrode layer as disclosed above. Additionally, instead of MOS transistors, bipolar transistors or diodes may be used as access devices in some embodiments.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
   an access device having a first terminal and a second terminal;
   an insulation layer;
   a first interlayer conductor contacting the first terminal, extending through the insulation layer, and having an electrode surface;
   a second interlayer conductor contacting the second terminal and extending through the insulation layer;
   a metal oxide layer contacting the electrode surface;
   a top electrode layer contacting the metal oxide layer, the top electrode layer comprising a first material;
   a first access line electrically connected to the top electrode layer; and
   a second access line electrically connected to the second interlayer conductor;
   wherein a layer comprised of the first material is not present between the second interlayer conductor and the second access line.

2. The memory of claim 1, wherein a layer comprised of a metal oxide is not present between the second interlayer conductor and the second access line.

3. The memory of claim 1, wherein the first and second terminal are located on a first side of the insulation layer and the first and second access lines are located on a second side of the insulation layer.

4. The memory of claim 1, wherein the metal oxide layer is characterized by having a programmable resistance.

5. The memory of claim 1, wherein the electrode surface of the first interlayer conductor consists essentially of a metal, and the metal oxide layer comprises an oxide of said metal.

6. The memory of claim 1, wherein the electrode surface of the first interlayer conductor consists essentially of a transition metal, and the metal oxide layer comprises an oxide of said transition metal.

7. The memory of claim 1, wherein the top electrode layer comprises a barrier metal or metal compound which acts as a barrier between the metal oxide layer and a mask layer during manufacturing of the memory.

8. The memory of claim 1, wherein the top electrode layer comprises a metal nitride.

9. The memory of claim 1, wherein the access device is a transistor, and the first terminal is a first conduction terminal of the transistor, and the second terminal is a second conduction terminal of the transistor, and wherein the transistor includes a third access line in contact with or acting as a gate of the transistor.

10. The memory of claim 1, wherein the first access line is comprised of a second material different than the first material.

11. A method of making a memory cell, comprising:
    forming an insulation layer on an access device comprising first and second terminals;
    forming vias through the insulation layer exposing the first and second terminals;
    forming a first interlayer conductor contacting the first terminal in one of the vias and extending through the insulation layer having an electrode surface;
    forming a second interlayer conductor in one of the vias contacting the second terminal;
    forming a metal oxide layer on an end of the first interlayer conductor not contacting the first terminal;
    forming a top electrode layer contacting the metal oxide layer on the first interlayer conductor, the top electrode layer comprising a first material;
    forming a first access line electrically connected to the top electrode layer; and
    forming a second access line electrically connected to the second interlayer conductor;
    wherein a layer comprised of the first material is not present between the second interlayer conductor and the second access line.

12. The method of claim 11, wherein a layer comprised of a metal oxide is not present between the second interlayer conductor and the second access line.

13. The method of claim 11, wherein the first and second terminals are located on a first side of the insulation layer and the first and second access lines are formed on a second side of the insulation layer.

14. The method of claim 11, wherein the metal oxide layer is characterized by having a programmable resistance.

15. The method of claim 11, wherein the electrode surface of the first interlayer conductor consists essentially of a metal, and the metal oxide layer comprises an oxide of said metal.

16. The method of claim 11, wherein the electrode surface of the first interlayer conductor consists essentially of a transition metal, and the metal oxide layer comprises an oxide of said transition metal.

17. The method of claim 11, wherein the top electrode layer comprises a barrier metal or metal compound which acts as a barrier between the metal oxide layer and a mask layer during manufacturing of the memory.

18. The method of claim 11, wherein top electrode layer comprises a metal nitride.

19. The method of claim 11, wherein the first access line comprises a material different than the first material.

20. A method of making a memory cell, comprising:
    forming an insulation layer on an access device comprising first and second terminals;
    forming vias through the insulation layer exposing the first and second terminals;
    forming a first tungsten plug in one of the vias, a first end of the first tungsten plug contacting the first terminal;
    forming a second tungsten plug in one of the vias, the second tungsten plug contacting the second terminal;
    oxidizing a second end of the first tungsten plug to form a tungsten oxide layer on the second end of the first tungsten plug;
    depositing a layer of titanium nitride covering the tungsten oxide layer and a portion of the insulation layer;
    patterning and etching the deposited layer of titanium nitride layer to form a top electrode layer;
    depositing a layer of access line material covering the top electrode layer and a portion of the insulation layer;

patterning and etching the access line material to form a first access line contacting the top electrode layer; and forming a second access line contacting the second tungsten plug;

wherein a layer of titanium nitride is not present between the second tungsten plug and the second access line.

* * * * *